(12) United States Patent
Cai et al.

(10) Patent No.: US 12,107,124 B2
(45) Date of Patent: Oct. 1, 2024

(54) BIPOLAR TRANSISTORS

(71) Applicant: GLOBALFOUNDRIES Singapore Pte. Ltd., Singapore (SG)

(72) Inventors: Xinshu Cai, Singapore (SG); Shyue Seng Tan, Singapore (SG); Vibhor Jain, Williston, VT (US); John J. Pekarik, Underhill, VT (US); Robert J. Gauthier, Jr., Williston, VT (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 160 days.

(21) Appl. No.: 17/559,085

(22) Filed: Dec. 22, 2021

(65) Prior Publication Data

US 2023/0197787 A1 Jun. 22, 2023

(51) Int. Cl.
| | | |
|---|---|---|
| *H01L 29/10* | (2006.01) | |
| *H01L 29/66* | (2006.01) | |
| *H01L 29/735* | (2006.01) | |
| *H01L 29/739* | (2006.01) | |

(52) U.S. Cl.
CPC ...... *H01L 29/1004* (2013.01); *H01L 29/6625* (2013.01); *H01L 29/66325* (2013.01); *H01L 29/735* (2013.01); *H01L 29/7393* (2013.01)

(58) Field of Classification Search
CPC ....... H01L 29/04; H01L 29/0804–0834; H01L 29/1008; H01L 29/0696; H01L 29/41708; H01L 29/42304; H01L 29/66234–66348; H01L 29/73–7378; H01L 29/739–7398; H01L 29/0847; H01L 29/0673; H01L 29/775; H01L 29/66439; H01L 29/78696; H01L 29/42392; H01L 27/0623; H01L 27/0823; H01L 29/1004; H01L 29/0649; H01L 21/8249; H01L 21/76897; H01L 21/823493; H01L 21/823475; H01L 21/823468; H01L 21/82285; H01L 21/823821
USPC ......... 257/197, 526, 350, E27.112, E21.461; 438/479, 430
See application file for complete search history.

(56) References Cited

U.S. PATENT DOCUMENTS

| | | | | |
|---|---|---|---|---|
| 4,495,512 A | * | 1/1985 | Isaac ................. | H01L 21/28518 |
| | | | | 438/362 |
| 5,059,544 A | * | 10/1991 | Burghartz ........... | H01L 29/7325 |
| | | | | 438/366 |
| 5,773,350 A | * | 6/1998 | Herbert ............... | H01L 29/7378 |
| | | | | 257/E29.183 |

(Continued)

OTHER PUBLICATIONS

EP Search Report in EP Application No. 221201109.0-1212 dated May 16, 2023, 10 pages.

(Continued)

*Primary Examiner* — Natalia A Gondarenko
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to bipolar transistors and methods of manufacture. The structure includes: an intrinsic base region; an emitter region above the intrinsic base region; a collector region under the intrinsic base region; and an extrinsic base region comprising metal material, and which surrounds the intrinsic base region and the emitter region.

17 Claims, 10 Drawing Sheets

(56) References Cited

U.S. PATENT DOCUMENTS

| | | | |
|---|---|---|---|
| 6,528,861 B1* | 3/2003 | Naem | H01L 29/7378 |
| | | | 257/586 |
| 6,982,442 B2 | 1/2006 | Chan et al. | |
| 7,425,754 B2 | 9/2008 | Akatsu et al. | |
| 7,521,772 B2 | 4/2009 | Adam et al. | |
| 2001/0017399 A1* | 8/2001 | Oda | H01L 29/66242 |
| | | | 257/E29.183 |
| 2005/0184359 A1 | 8/2005 | Akatsu et al. | |
| 2008/0164495 A1* | 7/2008 | Cohen | H01L 29/1004 |
| | | | 438/320 |
| 2011/0198671 A1 | 8/2011 | Boccardi et al. | |

OTHER PUBLICATIONS u et al., "Advanced Si/SiGe HBT architecture for 28-nm FD-SOI BiCMOS", IEEE, 2016, 4 pages.
Application and Drawings in related U.S. Appl. No. 17/542,793, filed Dec. 6, 2021, 27 pages.

* cited by examiner

BIPOLAR TRANSISTORS

BACKGROUND

The present disclosure relates to semiconductor structures and, more particularly, to bipolar transistors and methods of manufacture.

Bipolar transistors can be vertical transistors or lateral transistors. In a vertical bipolar transistor, carriers flow in a vertical direction. Since a collector region is formed in a position deep from a wafer surface, collector resistance increases, thus limiting the transistor performance especially for high-speed operation. In addition, the transistor requires a high-concentration buried layer, a collector epitaxial layer, and a deep trench isolation, etc. Consequently, the number of process steps increases and thus does the costs. On the other hand, the lateral bipolar transistor is simpler in structure than the vertical bipolar transistor. Also, in a lateral bipolar transistor, a collector electrode can be directly brought into contact with a collector region, which is advantageous for high-speed operation.

SUMMARY

In an aspect of the disclosure, a structure comprises: an intrinsic base region; an emitter region above the intrinsic base region; a collector region under the intrinsic base region; and an extrinsic base region comprising metal material, and which is adjacent to the intrinsic base region and the emitter region.

In an aspect of the disclosure, a structure comprises: a collector region within a semiconductor substrate; trench isolation structures isolating the collector region within the semiconductor substrate; an intrinsic base region comprising semiconductor material, the intrinsic base region provided over the collector region and between the trench isolation structures; an emitter region vertically above the intrinsic base region; a metal extrinsic base region on sides of the intrinsic base region and the emitter region; and a shared contact between the collector region and the extrinsic base region, the shared contact connecting the metal extrinsic base region.

In an aspect of the disclosure, a method comprises: forming an intrinsic base region; forming an emitter region above the intrinsic base region; forming a collector region under the intrinsic base region; and forming an extrinsic base region comprising metal material and which surrounds the intrinsic base region and the emitter region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to bipolar transistors and methods of manufacture. More specifically, the bipolar transistors include metal material to form a whole or part of an extrinsic base link. Advantageously, the metal material decreases the footprint (e.g., improves downward scaling of the devices) of the bipolar transistor by 30% by removing a collector pick-up region, in addition to improving parasitic components. In addition, the use of the metal material reduces the base resistance $R_B$ and collector resistance $R_C$ (compared to polysilicon or Si based transistors), as well as improves Fmax.

In more specific embodiments, the bipolar transistors include metal stacks used for an extrinsic base region, and for contacts to the collector region and the intrinsic base region. That is, the metal stacks may be interconnects to the intrinsic base region and to the collector region (e.g., collector pick-up), in addition to serving as the extrinsic base region. The metal stacks may be formed partially or completely over shallow trench isolation structures. Moreover, an emitter and the intrinsic base region may be formed between the metal stacks. Also, it should be recognized that the transistors include self-aligned base/collector and emitter/base junctions, which provides for lower parasitic components, improves scaling and reduces fabrication processing steps. As to the latter advantage, it is now possible to reduce at least one epitaxial growth process and two masking steps compared to known processes.

The bipolar transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the bipolar transistors of the present disclosure have been adopted from integrated circuit (IC) technology. For example, the structures are built on wafers and are realized in films of material patterned by photolithographic processes on the top of a wafer. In particular, the fabrication of the bipolar transistors uses three basic building blocks: (i) deposition of thin films of material on a substrate, (ii) applying a patterned mask on top of the films by photolithographic imaging, and (iii)

etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
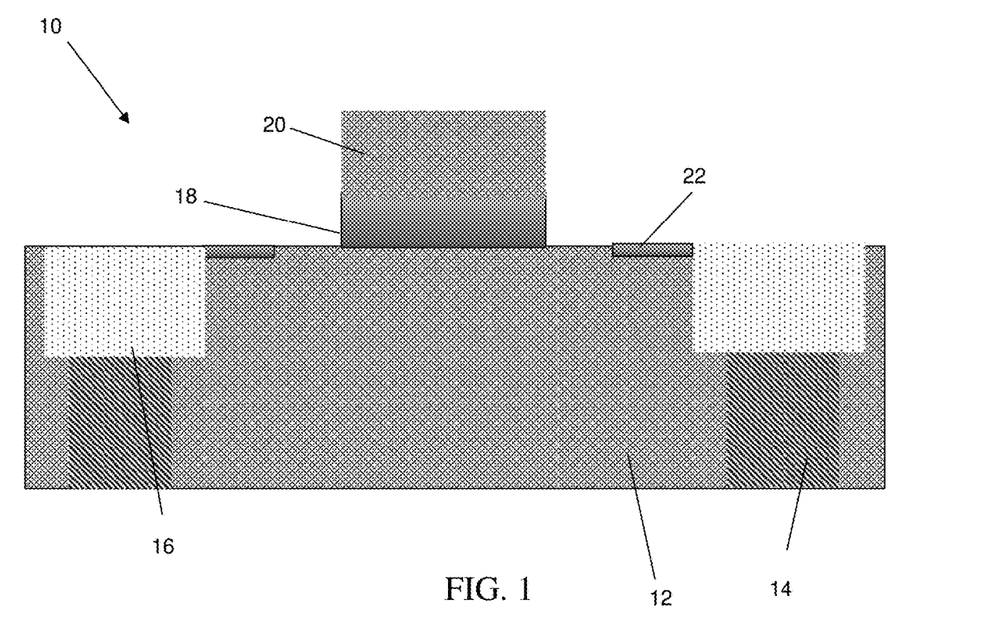
FIG. 1 shows a starting substrate, amongst other features, and respective fabrication processes in accordance with aspects of the present disclosure.

FIG. 1 shows a starting substrate in accordance with aspects of the present disclosure. In particular, the structure 10 of FIG. 1 includes a semiconductor substrate 12 composed of any suitable semiconductor material including, but not limited to, Si, SiGe, SiGeC, SiC, GaAs, InAs, InP, and other III/V or II/VI compound semiconductors. The semiconductor substrate 12 may be doped with a n-type dopant, e.g., arsenic, phosphorus, Sb, to form a collector region between deep trench isolation structures 14 and shallow trench isolation structures 16.

The deep trench isolation structures 14 and shallow trench isolation structures 16 may be formed by conventional lithography, etching and deposition methods known to those of skill in the art. For example, a resist formed over the semiconductor substrate 12 is exposed to energy (light) to form a pattern (opening). An etching process with a selective chemistry, e.g., reactive ion etching (RIE), will be used to transfer the pattern from the patterned photoresist layer to the semiconductor substrate 12 to form one or more deep trenches in the semiconductor substrate 12. Following the resist removal by a conventional oxygen ashing process or other known stripants, a polysilicon material lined with an oxide material may be deposited within the deep trenches to form the deep trench isolation structures 14. The shallow trench isolation structures 16 may be formed in a similar manner, with the use of oxide material within shallow trenches formed in the semiconductor substrate 12. Any residual material on the surface of the semiconductor substrate 12 can be removed by conventional chemical mechanical polishing (CMP) processes.

Still referring to FIG. 1, a stack of materials 18, 20 may be formed over the collector region, e.g., between the deep trench isolation structures 14 and shallow trench isolation structures 16. In embodiments, the stack of materials includes a SiGe material 18 and a hardmask material 20, e.g., $SiO_2$. In specific embodiments, the hardmask material 20 may be a TEOS and the SiGe material 18 may be used as an intrinsic base region of the transistor. The stack of materials 18, 20 may be deposited by conventional deposition methods. For example, the material 18 may be an epitaxial semiconductor material formed by a conventional epitaxial growth process on the semiconductor substrate 12; whereas the material 20 may be formed by e.g., chemical vapor deposition (CVD) processes. The deposition of the materials may be followed by conventional lithography and etching processes as described above.

The stack of materials 18, 20 may be provided between implant regions 22. In embodiments, the implant regions 22 may be heavily doped N+ regions in the semiconductor substrate 12. The implant regions 22 may be heavily doped regions composed of arsenic, phosphorous, Sb or another N-type dopant. The semiconductor substrate 12 may be doped by introducing a dopant by, for example, ion implantation that introduces a concentration of a dopant in the semiconductor substrate 12. In embodiments, a patterned implantation mask may be used to define selected areas exposed for the implantation. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The dopant can be driven in by a rapid thermal anneal process.

Figure 2:
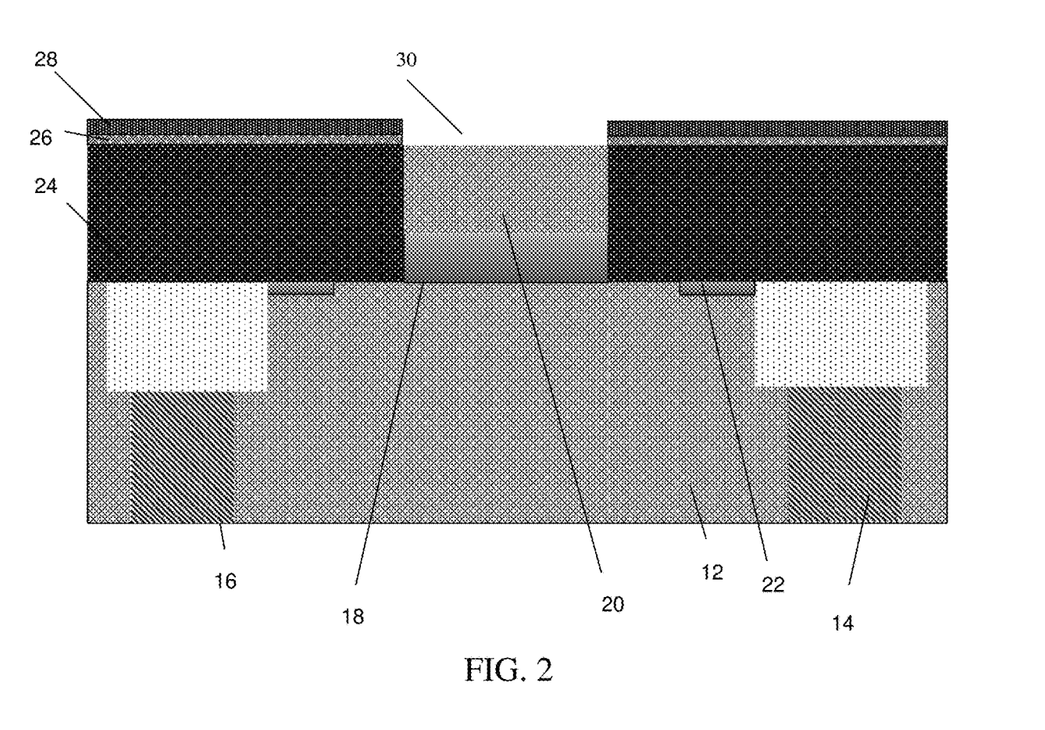
FIG. 2 shows a sacrificial material on a semiconductor substrate, amongst other features, and respective fabrication processes in accordance with aspects of the present disclosure.

In FIG. 2, a sacrificial material 24 may be formed on the semiconductor substrate 12, adjacent to the stack of materials 18, 20. In addition, masking materials 26, 28 may be formed over the sacrificial material 24. In embodiments, the sacrificial material 24 may be, e.g., polysilicon, and the masking materials 26, 28 may be $SiO_2$ and SiN, respectively. The materials 24, 26, 28 may be deposited using conventional deposition methods, e.g., CVD. In embodiments, the sacrificial material 24 may be subjected to a chemical mechanical polishing (CMP) prior to the deposition of materials 26. In this way, the material 20 may be exposed and planar with the sacrificial material 24. Also, an opening 30 aligned with and over the stack of materials 18, 20 may be provided within the materials 26, 28. The opening 30 may be formed by conventional lithography and etching processes as already described herein. In further embodiments, the sacrificial material 24, 18 and 20 may be deposited and defined through one mask layer, forming the opening 30.

Figure 3:
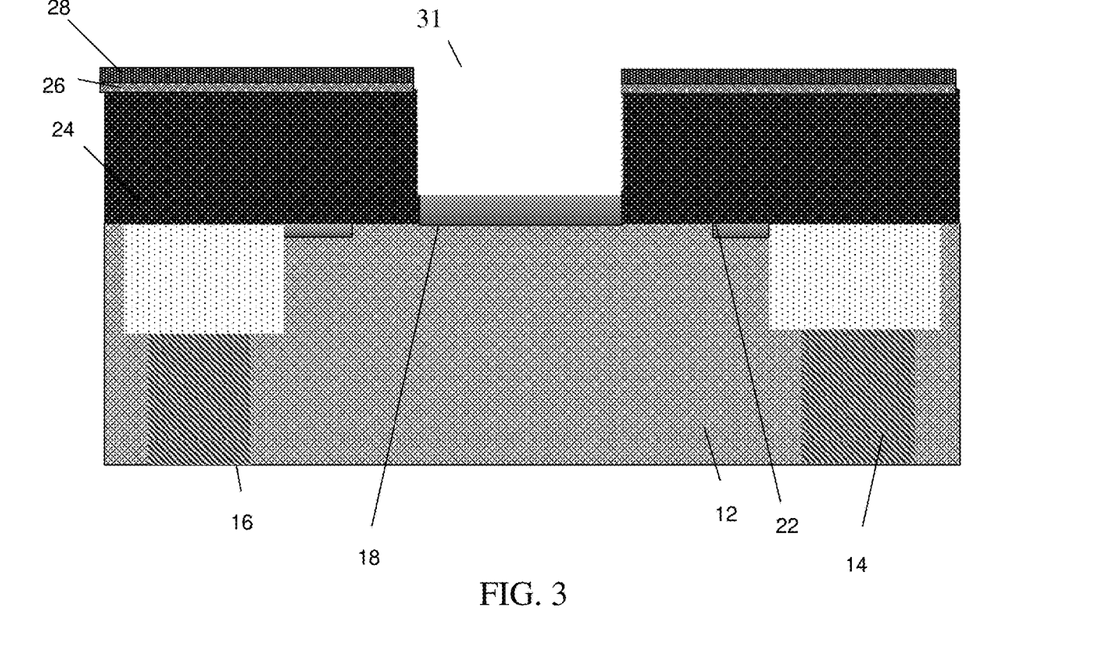
FIG. 3 shows an opening aligned with an intrinsic base region, amongst other features, and respective fabrication processes in accordance with aspects of the present disclosure.

As shown in FIG. 3, the material 20 may be removed to form an opening 31, leaving intact the material 18 (e.g., intrinsic base region). In embodiments, the material 20 may be removed by a conventional etching process. In more specific embodiments, the etching process may be a maskless etching process using an etchant chemistry that is selective to the oxide material 20 (and which does not attack the sacrificial material 24 or the material 18). It should also be recognized that the opening 31 may allow a self-aligned process to form the emitter over the intrinsic base region as described in more detail below.

Figure 4:
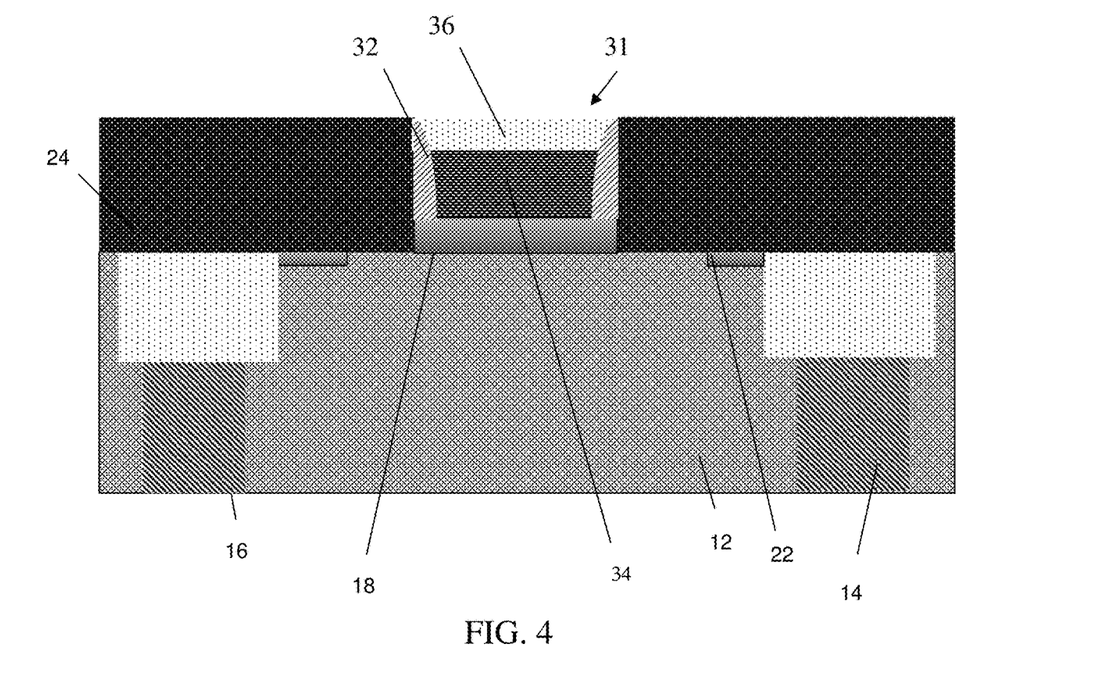
FIG. 4 shows an emitter material in the opening and above the intrinsic base region, amongst other features, and respective fabrication processes in accordance with aspects of the present disclosure.

In FIG. 4, sidewall spacers 32 are formed in the opening 31 on the sidewalls of the sacrificial material 24. In embodiments, the sidewall spacers 32 may be used as spacers composed of oxide and nitride materials to isolate the emitter and base region. The sidewall spacers 32 may be formed by a conventional deposition process, e.g., CVD, followed by an anisotropic etching process.

FIG. 4 further shows an emitter material 34 formed within the opening 31, between the sidewall spacers 32. As the emitter material 34 is formed within the opening, it will be self-aligned with the intrinsic base region, e.g., semiconductor material 18. In embodiments, the emitter material 34 may be a N-doped polysilicon material formed by an epitaxial growth process with an in-situ doping. An insulator material 36 may be formed over the emitter material 34, within the opening 31. In more specific embodiments, the insulator material 36 may be a $SiO_2$ layer generated by thermal oxidation. The materials 26, 28 may be removed from the surface of the sacrificial material 24 using, for example, a wet etch process.

Figure 5:
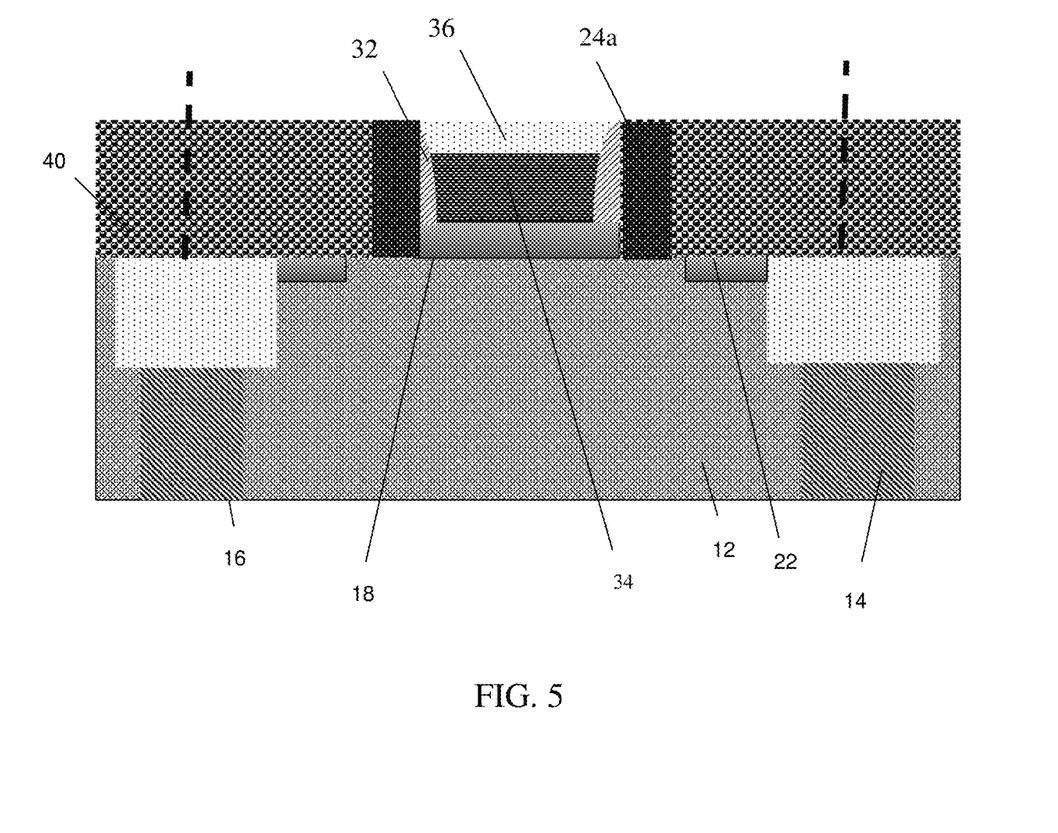
FIGS. 5 and 6 show an extrinsic base region adjacent to the emitter material, amongst other features, and respective fabrication processes in accordance with aspects of the present disclosure.
Figure 6:
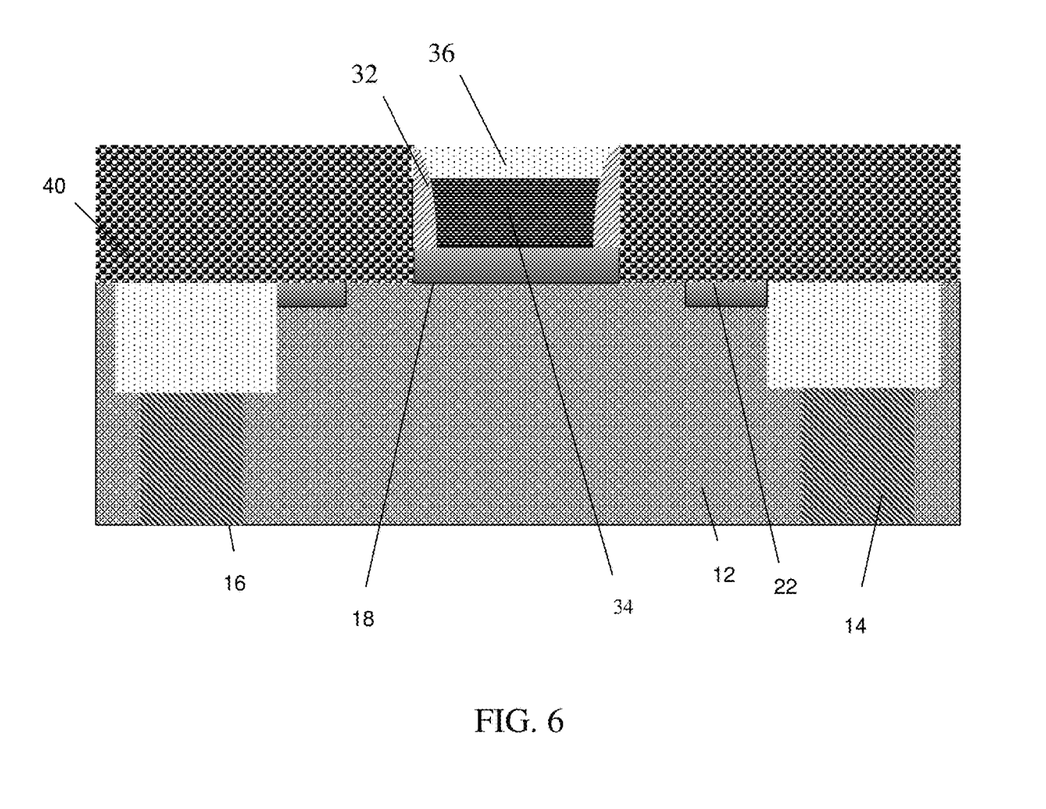

FIG. 5 shows a metal material 40 adjacent to the emitter material 34. For example, as representatively shown in FIG. 5, the sacrificial material may be partially removed, leaving sidewall spacers 24a. In an optional embodiment, as shown in FIG. 6, the sacrificial material may be fully removed. In either scenario, a metal material 40 may be deposited over the shallow trench isolation structures 16 and implants 22, adjacent to the sidewall spacers 24a (of FIG. 5) or the sidewall spacers 36 (of FIG. 6). In embodiments, the metal material 40 may contact or connect to a side surface of the material 18, e.g., intrinsic base. Moreover, the metal material 40 be fully or partially over the shallow trench isolation structures 16. As to the latter feature, this is represented by the dashed lines in FIG. 5. The metal material 40 may be any metal material such as, but not limited to, TiN, TaN, W, etc.

In further embodiments, the metal material 40 may be any workfunction metal material(s) used for gate electrodes. The metal material 40 may be used as an extrinsic base region and a contact to the collector region of the semiconductor substrate 12 and intrinsic base region.

Figure 7:
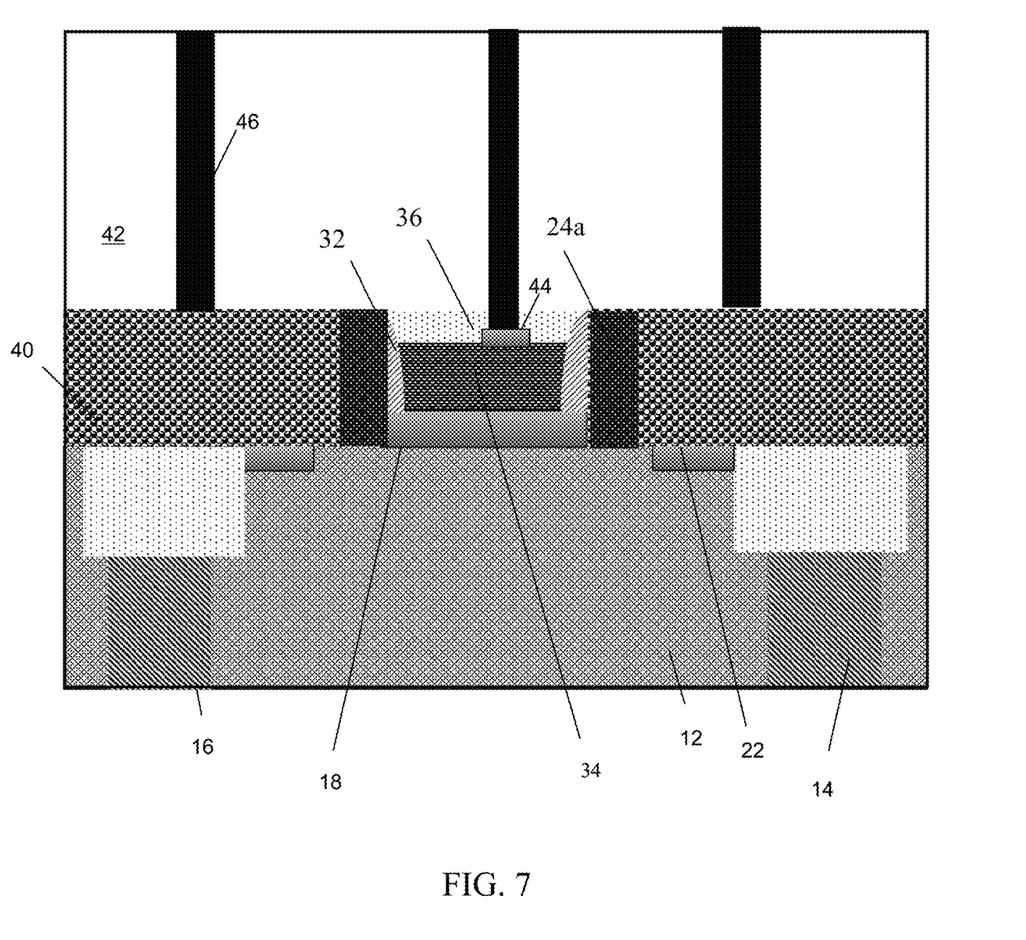
FIG. 7 shows contacts to the collector region, extrinsic base region, and the emitter region, amongst other features, and respective fabrication processes in accordance with aspects of the present disclosure.

Referring to FIG. 7, contacts 46 may be formed to the collector region, e.g., semiconductor substrate 12, extrinsic base region, e.g., metal material 40 and the emitter region, e.g., material 34. As seen in FIG. 7, the contacts 46 to the collector region, e.g., semiconductor substrate 12 and extrinsic base region, e.g., metal material 40, are shared contacts, connecting to the metal material 40. In this way, it is now possible to significantly reduce the footprint of the transistor. Also, by using the metal material 40, it is possible to significantly reduce the base and collector resistance, hence improving Fmax.

To form the contacts 46, vias are formed in interlevel dielectric material or stack of materials 42 to expose surfaces of the emitter (e.g., semiconductor material 34) and metal material 40. A silicide process may be performed on the exposed semiconductor material 34 to form silicide contacts 44. As should be understood by those of skill in the art, the metal material 40 does not require silicide. Also, as should be understood by those of skill in the art, the silicide process begins with deposition of a thin transition metal layer, e.g., nickel, cobalt or titanium, over the semiconductor material 34. After deposition of the material, the structure is heated allowing the transition metal to react with exposed silicon (or other semiconductor material as described herein) forming a low-resistance transition metal silicide. Following the reaction, any remaining transition metal is removed by chemical etching, leaving silicide contacts 44.

Conductive material may then be deposited within the vias, over the silicide contacts 44 and the metal material 40, to form the contacts 46. The conductive material may be tungsten or aluminum, which may also include a barrier liner material. Any excess conductive material on the surface of the interlevel dielectric material or stack of materials 42 may be removed by a conventional CMP process.

Figure 8:
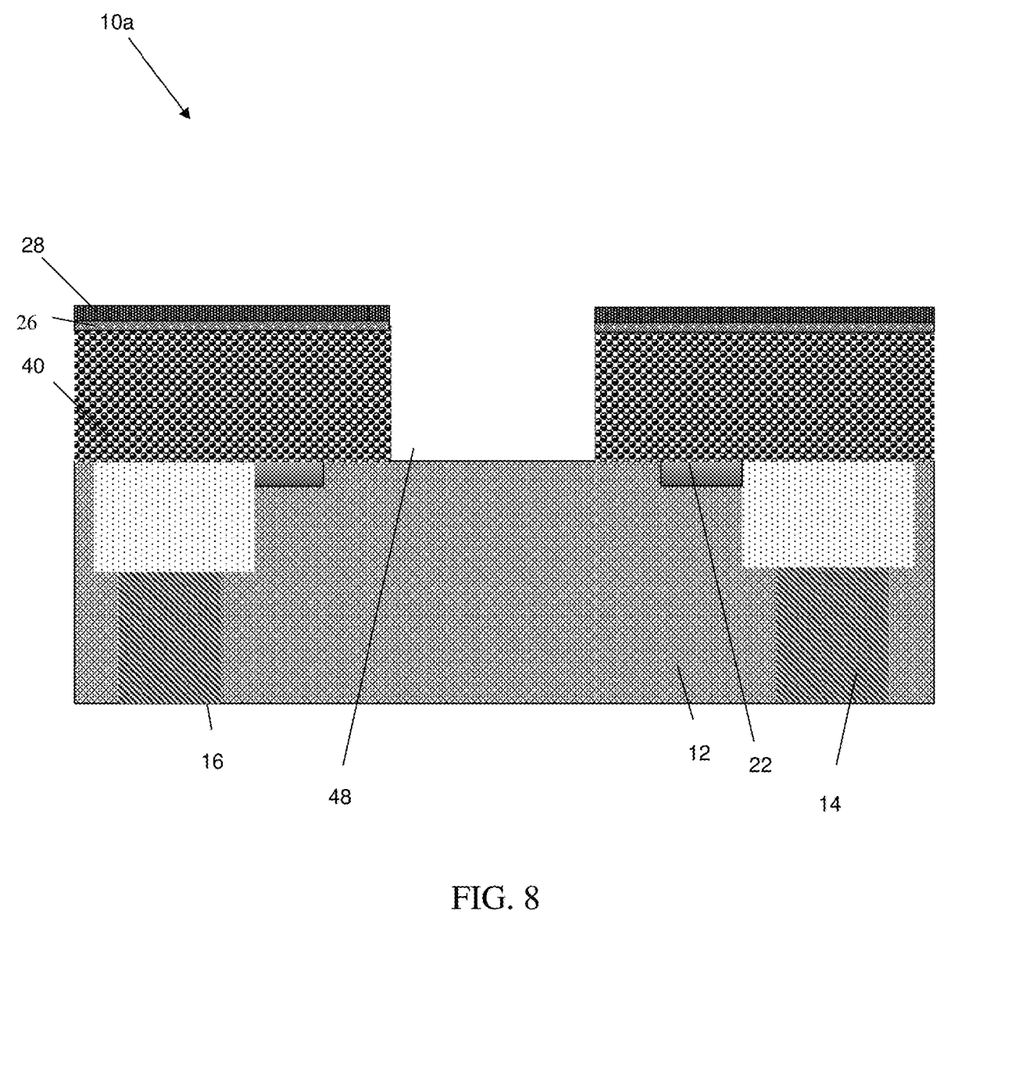
FIGS. 8-10 show fabrication processes and respective structures in accordance with additional aspects of the present disclosure.
Figure 9:
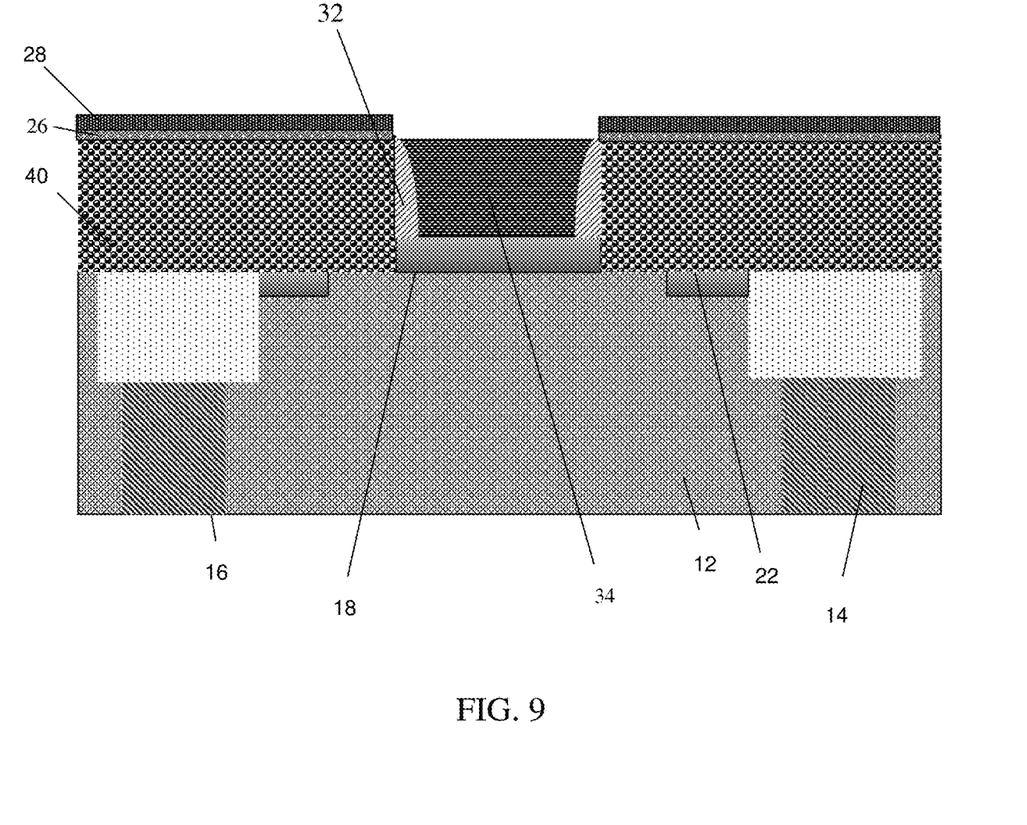
Figure 10:
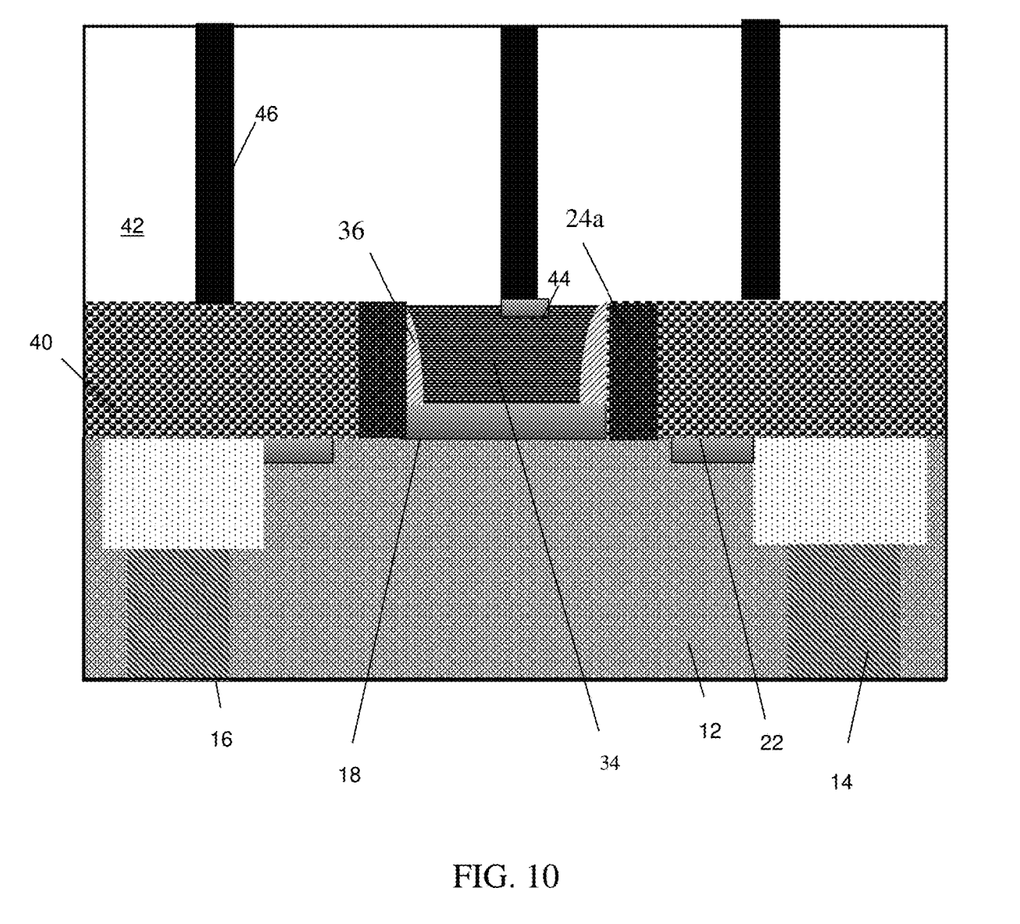

FIGS. 8-10 show fabrication processes and respective structures in accordance with additional aspects of the present disclosure. More specifically, in FIG. 8 the structure 10a includes the metal material 40 formed directly on the semiconductor substrate 12, implant regions 22 and shallow trench isolation structures 16. The metal material 40 may be a gate metal material as already described herein, deposited by a conventional deposition method, e.g., CVD. Masking materials 26, 28 may be formed over the metal material 40. An opening may be formed in the masking materials used to form trench 48 in the metal material 40. The trench 48 may be formed by conventional lithography and etching processes such that a further explanation is not required for a complete understanding of the present disclosure.

In FIG. 9, an intrinsic base material 18, e.g., SiGe, may be deposited within the trench 48 using conventional deposition methods, e.g., epitaxial growth processes. Sidewall spacers 32 may be formed in the trench 48 on the sidewalls of the metal material 40. In embodiments, the sidewall spacers 32 may be used as extrinsic base spacers composed of oxide and nitride materials. The sidewall spacers 32 may be formed by a conventional deposition process, e.g., CVD, followed by an anisotropic etching process. In alternative embodiments, the sidewall spacers 32 may be formed on sidewalls spacers (e.g., polysilicon or another insulator material) as shown, for example, in FIG. 5. An emitter material 34 may be formed between the sidewall spacers 32.

In embodiments, the emitter material 34 may be a N-doped polysilicon material formed by an epitaxial growth process with an in-situ doping.

In FIG. 10, contacts 46 may be formed to the collector region, e.g., semiconductor substrate 12, extrinsic base region, e.g., metal material 40, and the emitter region, e.g., material 34. As seen in FIG. 10, the contacts 46 to the collector region, e.g., semiconductor substrate 12 and extrinsic base region, e.g., metal material 40, are shared contacts connecting to the metal material 40. Again, in this way, it is now possible to significantly reduce the footprint of the device. Also, by using the metal material 40, it is possible to significantly reduce the base and collector resistance, hence improving Fmax.

Figure 11:
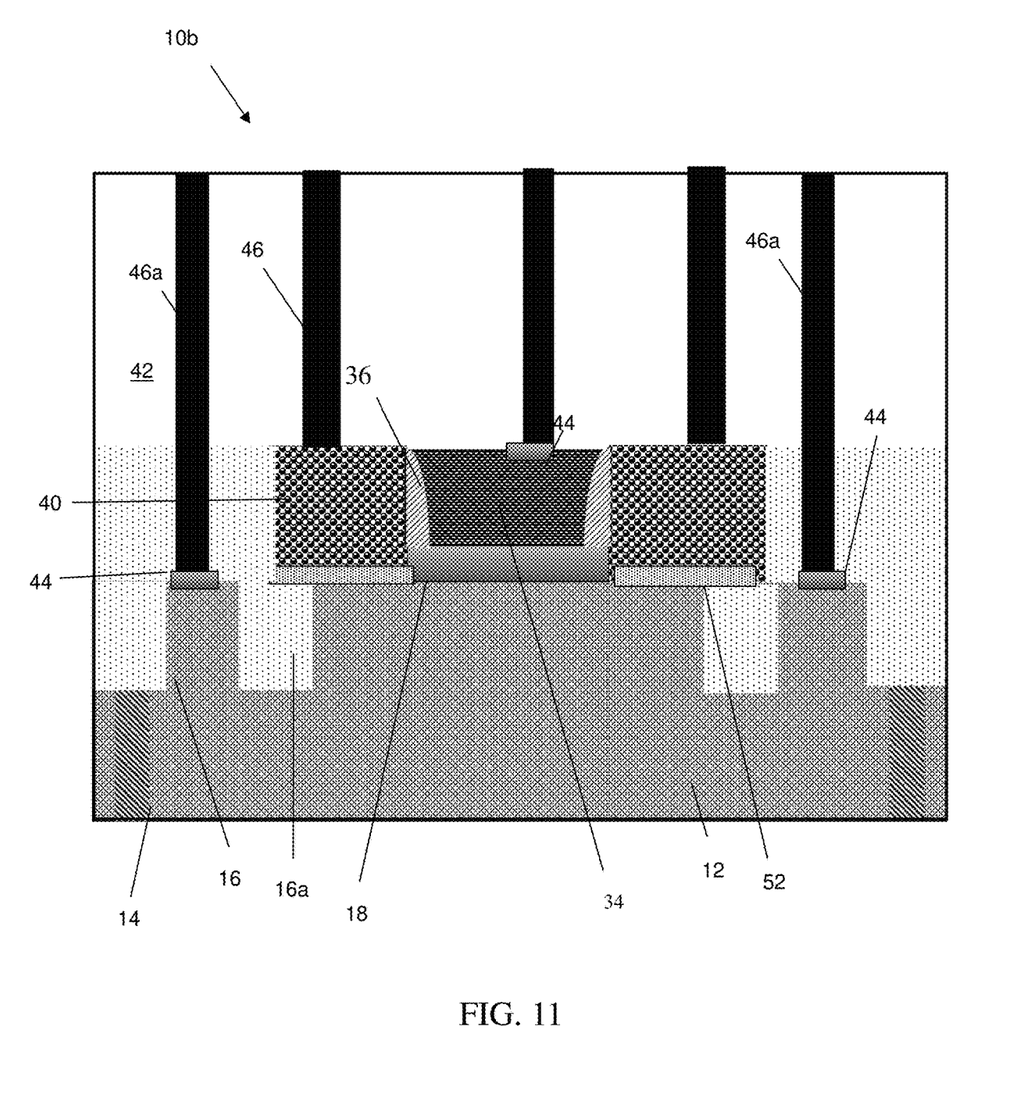
FIG. 11 shows a bipolar transistor, amongst other features, and respective fabrication processes in accordance with further aspects of the present disclosure.

FIG. 11 shows a bipolar transistor, amongst other features, and respective fabrication processes in accordance with further aspects of the present disclosure. More specifically, in the structure 10b shown in FIG. 11, the contacts to the extrinsic base region and the collector region are no longer shared. Instead, contacts 46 connect to the metal material 40, e.g., extrinsic base region, and emitter region, e.g., semiconductor material 34. In addition, contacts 40a extend directly to and in contact with the semiconductor substrate 12, on sides of the metal material 40. The contacts 40a connect to the collector region (e.g., collector pick up in the semiconductor substrate 12), and may be formed on silicide regions 44 between shallow trench isolation structures 16, 16a.

Figure 12:
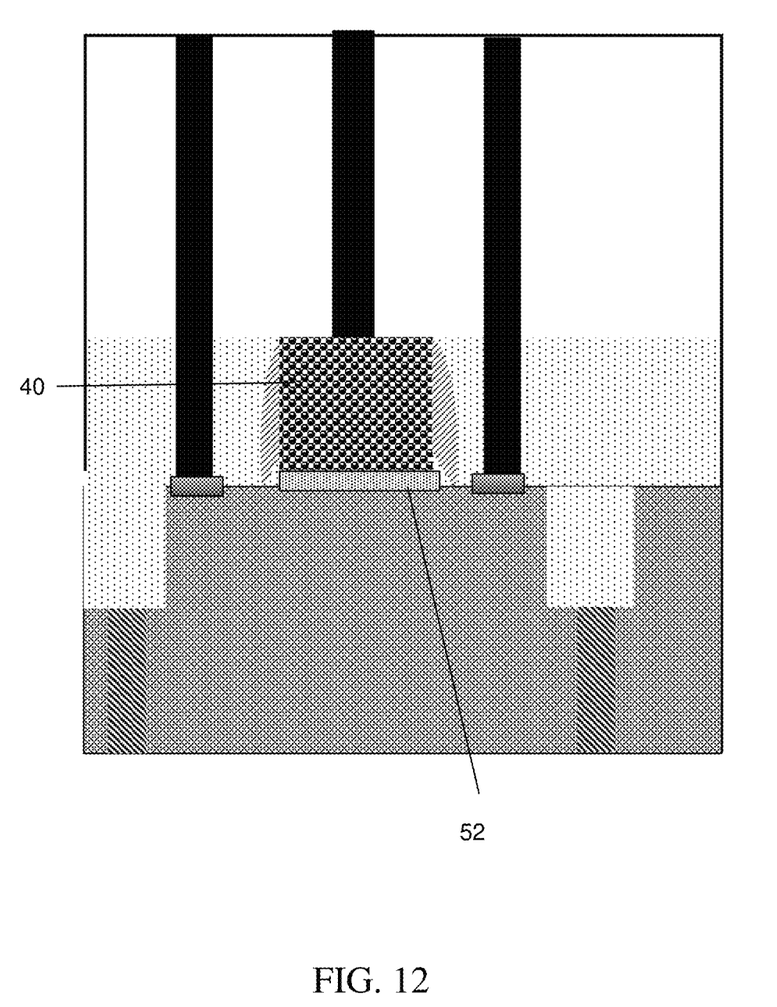
FIG. 12 shows a bipolar transistor with metal material and a dielectric pedestal formed from utilizing a same logic metal gate material and gate oxide in accordance with further aspects of the present disclosure.

Still referring to FIG. 11, the metal material 40, e.g., extrinsic base region, may partly overlap onto the shallow trench isolation structures 16a. Moreover, the metal material 40, e.g., extrinsic base region, may also be formed over a dielectric pedestal 52, formed over the semiconductor substrate 12 and adjacent to the intrinsic base, e.g., semiconductor material 18. The dielectric pedestal 52 may be composed of an oxide material, which is deposited and patterned prior to the formation of the metal material 40. In optional embodiments, sidewall spacers, e.g., polysilicon material, may be placed in-between the metal material 40 of the extrinsic base and the material 18 of the intrinsic base and the emitter material 34. In further embodiments, the metal material 40 and the dielectric pedestal 52 may also be formed from utilizing the same conventional logic metal gate material and gate dielectric material, e.g., gate oxide, as shown in FIG. 12.

The bipolar transistors can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   an intrinsic base region above and directly contacting an underlying semiconductor substrate;
   an emitter region above the intrinsic base region;
   a collector region comprising the underlying semiconductor substrate and under the intrinsic base region;
   an extrinsic base region comprising metal material, the metal material being adjacent to the intrinsic base region and isolated from the emitter region by sidewall spacers; and
   a first insulator material above a top surface of the emitter region and being coplanar with the sidewall spacers and the metal material of the extrinsic base region,
   wherein the metal material is directly contacting and fully covers shallow trench isolation structures and a doped region in the underlying semiconductor substrate adjacent to the shallow trench isolation structures, and the doped region includes a same dopant type as the underlying semiconductor substrate.

2. The structure of claim 1, wherein the metal material comprises two metal stacks.

3. The structure of claim 1, wherein the extrinsic base region connects to the intrinsic base region at a sidewall region of the intrinsic base region and the intrinsic base region comprises a layer of semiconductor material directly contacting the underlying semiconductor substrate.

4. The structure of claim 1, further comprising a second insulator material between the sidewall spacers and the emitter region, and contacting a top surface of the intrinsic base region and outer sidewalls of the emitter region, wherein the second insulator material contacts the first insulator material and is between the sidewall spacers and the first insulator material above the emitter region.

5. The structure of claim 1, wherein the sidewall spacers comprise polysilicon material.

6. The structure of claim 1, further comprising a shared contact to both the extrinsic base region and the collector region and the intrinsic base region comprises a layer of semiconductor material directly on the underlying semiconductor substrate.

7. The structure of claim 6, wherein the shared contact connects to the metal material of the extrinsic base region.

8. The structure of claim 1, wherein the metal material is fully over the shallow trench isolation structures, and directly contacts an edge of the intrinsic base region.

9. The structure of claim 1, wherein the collector region is devoid of a dedicated collector contact region.

10. A structure comprising:
    a collector region within a semiconductor substrate;
    trench isolation structures isolating the collector region within the semiconductor substrate;
    an intrinsic base region comprising semiconductor material, the intrinsic base region provided above the collector region and between the trench isolation structures;
    an emitter region vertically above the intrinsic base region;
    a metal extrinsic base region on sides of the intrinsic base region and the emitter region;
    a shared contact between the collector region and the extrinsic base region, the shared contact connecting the metal extrinsic base region;
    sidewall spacers isolating an edge of the intrinsic base region and a sidewall of the emitter from the metal extrinsic base region;
    an insulator material between the sidewall spacers and the emitter region, the insulator material being on a top surface of the intrinsic base region; and
    an insulator layer above the emitter region and directly contacting the insulator material, the insulator layer being coplanar with the sidewall spacers and an upper surface of the metal extrinsic base region.

11. The structure of claim 10, wherein the collector region comprises a doped semiconductor material.

12. The structure of claim 10, wherein the metal extrinsic base region fully overlaps the trench isolation structures.

13. The structure of claim 10, wherein the sidewall spacers separating the intrinsic base region and the emitter region from the metal extrinsic base region are located between the insulator material and the metal extrinsic base region along a height thereof.

14. The structure of claim 10, wherein the metal extrinsic base region comprises gate metal material.

15. The structure of claim 10, wherein the intrinsic base region comprises SiGe.

16. The structure of claim 10, wherein the metal extrinsic base region connects to the intrinsic base region at a sidewall region.

17. A method comprising:
    forming an intrinsic base region above an underlying semiconductor substrate;
    forming an emitter region above the intrinsic base region;
    forming a collector region comprising the underlying semiconductor substrate and under the intrinsic base region;
    forming an extrinsic base region comprising metal material, the metal material being adjacent to and isolated from the intrinsic base region and the emitter region by sidewall spacers; and
    forming a first insulator material above a top surface of the emitter region and being coplanar with the sidewall spacers and the metal material of the extrinsic base region,
    wherein the metal material is formed directly contacting and fully covering shallow trench isolation structures and a doped region in the underlying semiconductor substrate adjacent to the shallow trench isolation structures, and the doped region includes a same dopant type as the underlying semiconductor substrate.

* * * * *